United States Patent [19]

Haj-Ali-Ahmadi et al.

[11] Patent Number: 5,313,097
[45] Date of Patent: May 17, 1994

[54] HIGH DENSITY MEMORY MODULE

[75] Inventors: Javad Haj-Ali-Ahmadi, Austin, Tex.; Paul A. Farrar, South Burlington, Vt.; Jerome A. Frankeny, Taylor; Richard F. Frankeny, Austin, both of Tex.; Karl Hermann, Romulus, N.Y.; Jacqueline A. Shorter-Beauchamp, Austin; John A. Williamson, Round Rock, both of Tex.

[73] Assignee: International Business Machines, Corp., Armonk, N.Y.

[21] Appl. No.: 976,770

[22] Filed: Nov. 16, 1992

[51] Int. Cl.$^5$ .................. H01L 23/02; H02B 1/00
[52] U.S. Cl. .................. 257/706; 257/712; 257/720; 257/724; 257/727; 361/714
[58] Field of Search .......... 257/712, 713, 718, 706, 257/720, 723, 724, 726, 727; 361/389

[56] References Cited

U.S. PATENT DOCUMENTS

| | | | |
|---|---|---|---|
| 3,812,402 | 5/1974 | Garth | 317/100 |
| 4,128,289 | 12/1978 | Occhipinti | 339/75 MP |
| 4,408,220 | 10/1983 | Calabro | 357/81 |
| 4,525,921 | 7/1985 | Carson et al. | 29/577 |
| 4,558,912 | 12/1985 | Coller et al. | 339/64 M |
| 4,695,872 | 9/1987 | Chatterjee | 357/75 |
| 4,756,694 | 7/1988 | Billman et al. | 439/61 |
| 4,850,892 | 7/1989 | Clayton et al. | 439/326 |
| 4,855,809 | 8/1989 | Malhi et al. | 357/75 |
| 4,943,844 | 7/1990 | Osciłowski | 357/74 |
| 4,975,763 | 12/1990 | Baudouin et al. | 357/74 |
| 4,982,264 | 1/1991 | Cragon et al. | 357/75 |
| 4,983,533 | 1/1991 | Go | 437/7 |
| 5,019,943 | 5/1991 | Fassbender et al. | 361/396 |
| 5,019,946 | 5/1991 | Eichelberger et al. | 361/414 |
| 5,023,695 | 6/1991 | Umezawa et al. | 257/718 |
| 5,025,306 | 6/1991 | Johnson et al. | 357/75 |
| 5,031,072 | 7/1991 | Malhi et al. | 361/387 |
| 5,049,981 | 9/1991 | Dahringer | 357/81 |
| 5,051,865 | 9/1991 | Kato | 361/386 |
| 5,059,557 | 10/1991 | Cragon et al. | 437/208 |

FOREIGN PATENT DOCUMENTS 57-15449 1/1982 Japan.
58-197769 11/1983 Japan.
61-88547 5/1986 Japan.

OTHER PUBLICATIONS

IBM Technical Disclosure Bulletin, vol. 32, No. 1, Jun. 1989 p. 151.

Primary Examiner—Mark V. Prenty
Attorney, Agent, or Firm—Laurence R. Letson

[57] ABSTRACT

A memory module is built up from a power distribution assembly in the form of plates forming a capacitor of low inductance and a flexible circuit substrate. The circuit substrate is populated with precisely positioned contact pads for the power, read, write and address lines of memory chips that contact the substrate. Memory chips are fixed to heat spreaders and loaded into a chip holder which positions the chips for contact with the contact pads on the substrate. The substrate contact pads are plated to form dendritic crystals of palladium and the memory chips are provided with solder balls on the contact pads of the memory chip. The solder balls are held in contact with the contact pads by the compressive forces of clamping a heat sink over the heat spreaders for testing, and the assembly may be readily disassembled to replace any defective memory. The compression connection of the chips to the substrate may be relied on or the solder balls may be reflowed to establish permanent solder connections.

20 Claims, 10 Drawing Sheets

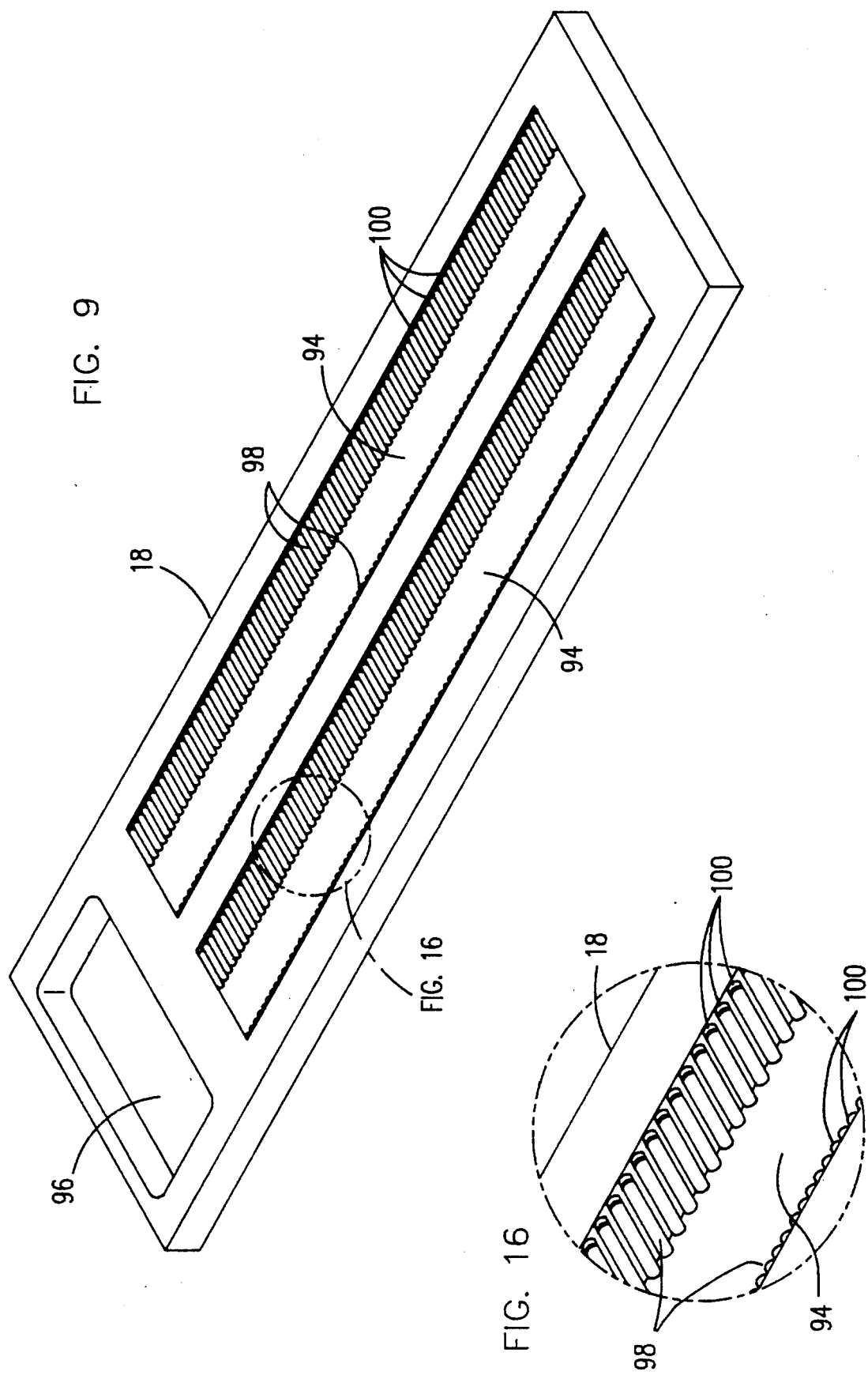

HIGH DENSITY MEMORY MODULE

FIELD OF THE INVENTION

This invention relates to computer memory assemblies and more specifically to the fabrications, testing and operation of large capacity, high density memory assemblies for high speed computers having large memory requirements.

BACKGROUND OF THE INVENTION

As computers operate at higher rates and perform more operations in a given time, and perform tasks and operate programs which involve graphics and graphical displays, the amount of memory required for the computer increases dramatically and the need for higher density memory assemblies or modules increases likewise. Graphics and graphical display computer applications, together with the manipulation of the graphical representation, require very large quantities of memory which must be quickly and reliably accessible to the central processing unit and/or related other processors in the computer.

An example of a computer with such a need for a very large amount of memory is the IBM RISC System/6000 computer which typically may have a need for 32-500 megabytes of memory capacity.

When a computer speed approaches MIPS (million instructions per second), the speed of processing instructions ceases to be limited by the member of cycles per second at which the processor can operate. Rather, the operational speed is limited by the speed of the electricity traveling through the connectors to and from adjacent electrical elements and, particularly, into and back from the memory in order to access and retrieve stored data and/or access and store data in the memory. It is necessary to minimize the length of conductors to and from and within the memory modules in order to minimize the amount of time lost in processing. It is necessary, therefore, to make the memory chip assemblies as compact as possible and minimizing memory cycle response time, therefore, making the computer more efficient.

Presently, when memory is manufactured, the memory chips are formed by depositing conductive and semi-conductive circuits onto the surface of silicon wafers in standard and conventional patterns. These circuits, which when appropriately powered and accessed, either will accept "write" commands or signals and retain them representing stored bits of data or information or will provide electrical signals in response to "read" commands, permitting the computer to determine the status of bits of information stored in the memory circuits, which represents bits of data previously stored.

The manufacturing techniques for making the particular memory chips and memory circuits are well known conventional techniques. While these manufacturing techniques are understood and practiced widely, they may result in memory chips and memory circuits which will have varying response speeds, i.e., memory response cycle times of 20, 25 or 30 nanoseconds. The varying response times occur because the manufacturing process is subject to variables which may not be accurately enough controlled or may not be economically controllable to yield only the highest speeds or the desired speeds for the memory.

Further, due to problems or variables in the manufacturing process, memory chips which may be designed to contain a multiple megabit storage capacity may have a portion of its capacity rendered inoperable or defective. For example, a stray airborne object or contaminate particle may be deposited upon the surface of the chip during the manufacturing process which results in shorting adjacent circuits or improper connections to positions of a circuit, rendering at least that portion of the chip defective or inoperable. One characteristic of memory chips and computer memory is that even though a portion of a memory chip may be defective or inoperable, the remainder of the chip may be fully functional and unaffected by the defect. Therefore, a chip having a nominal capacity of one megabits of data in fact may have a smaller capacity, and yet remain economically and physically usable in a device which may use additional chips to offset the defective shortfall or where there are smaller demands for memory capacity.

After the memory chips have been manufactured, they may be tested to determine their capacity for retaining data. The chips may be sorted into categories such as one-quarter good, one-half good, or full good chips depending upon the amount of usable and operable memory capacity on the chip. These memory chips then can be assembled into memory modules or memory arrays in sufficient numbers to provide the necessary minimum amount of memory for a particular computer or application.

As advances in the design and manufacture of memory circuits and memory chips occur and the density on the chips increases, the cost of memory capacity has decreased. One approach has been merely to install excess memory capacity in the computer to assure that the minimum stated memory requirement for the computer or application is adequately met by operational memory circuits, even though additional memory is in fact present and usable.

One step of the manufacturing and testing procedure for the manufacture of memory is to assemble it or connect it to test apparatus in such a manner that it may be operated and tested; and then it is placed in an environment of elevated temperatures and operated to cause any marginal or weak circuits on the chip to fail prior to installation. This process is commonly referred to as burn-in. The burn-in process causes an early failure of marginal circuits, thereby allowing the identification of those chips and the quantifying of the available remaining operational memory prior to installation into a memory module or computer. Burn-in is most efficiently accomplished when the memory modules are assembled and, thus, most easily connected and tested. The cost of replacing defective memory greatly increases after assembly.

Memory at the time of test may provide indications of false failures. When false failures occur, the memory circuits themselves cannot be relied upon and, therefore, must be detected at an early stage to prevent undue re-work or repair costs. As an alternative, the individual testing of each chip is prohibitively expensive.

With short response times required and large quantities of memory capacity desired in a particular computer environment, it becomes very important to have an adequate quantity of good and operational memory chips installed in an appropriate assembly or module which is then installed into the computer.

Several approaches exist in the prior art. One approach to memory fabrication involves what is commonly referred to a memory cube. To form a memory cube, several chips in a semi-finished state are joined together, typically, by use of an adhesive or other bonding material to form a cube or stack of chips. After the chips have been joined together, at least one of the external surfaces of the assembly of chips is then ground and polished to expose the read, write and address lines (conductors) and power connections controlling the individual memory circuits. After the conductors are exposed, through conventional steps of masking and vapor deposition of metals, contact pads are formed in electrical continuity with the respective conductors to provide an interface by which the memory cube may be powered and operated.

One serious drawback to the memory cube fabrication procedure is that the memory chips of the cube typically cannot be tested until such time as adequate electrical contacts have been formed and connected to the conductors. Therefore, the memory cube may be fabricated from untested memory chips or chips that have not been fully tested after burn-in. If, after assembly and fabrication of the finished memory cube, a chip within the cube is found to be partially or completely defective, the alternatives available to the memory fabricator are: the cube be discarded, the cube be disassembled and the defective portions of the cube removed, or additional memory cubes be fabricated and installed in the system to compensate for the defective memory in the cubes within the system if the system design permits.

Disassembling the memory cubes, breaking the bonding between chips, and removing the defective chips from the assembly may result in damage to otherwise good remaining chips in the memory cube.

The building of oversized or over-capacity memory assemblies to circumvent the defect fallout associated with the manufacturing process of the chips, can result in substantial excess costs associated with the computer. While the cost of memory chips and memory capacity has steadily declined, if it is necessary to install excess capacity in the computer in order to meet at least the minimum memory requirements for the computer or its applications, the computer manufacturer suffers substantial economic disadvantage.

Another prior art approach to overcoming the problem of defective memory while avoiding the economic cost of over populating the computer memory with memory capacity in order to compensate for the defective memory, is the use of connectors on substrates or motherboards to permit the replacement of memory boards carrying memory chips. When a defective memory chip is detected and need replacement, the memory board carrying that chip may be removed by disconnecting the memory board contacts from the connector and a replacement memory board installed. While this approach certainly solves the problem of having to install substantial quantities of excess memory, the expense of many connectors and associated circuit boards for the memory chips may not be an attractive economic alternative.

Further, use of connectors includes, within the system, additional possible failure points where electrical continuity between the computer processor and the memory chips may not be reliable.

Further, if the memory chips that are found to be defective or inoperative must be removed from the memory boards, the re-work of those memory board assemblies may damage substantially other memory chips installed on the boards or destroy the memory board or substrate upon which the memory chips have been mounted. A not insignificant consideration is the cost of the re-work labor involved in such repair of the memory modules and memory boards.

The use of memory chips bonded to memory boards or memory cubes may require the complete assembly of the memory module prior to testing. This eliminates opportunities early in the manufacturing and assembly process for detecting defective memory chips and the substitution of operative memory chips, therefore.

On the other hand, the individual testing of discrete memory chips to determine which memory chips are partially defective and the extent of the defects, is very expensive, time consuming and relatively inefficient.

When memory is assembled in a cube or other stack type structure and fixed to form the module or assembly, the cooling of the memory chips becomes a problem. As electricity is conducted to and from the chips and the circuits formed thereon, heat is created. If the heat is not adequately dissipated and the memory chips are not maintained at a cool operating temperature, the resistance of the conductors becomes sufficiently high as to interfere with proper memory operation and potentially cause the destruction of the circuits of the memory chip itself.

Therefore, it is necessary to accommodate a cooling system in the memory module. In the past, efforts have involved alternating the memory chips and cooling spreaders within the memory cubes.

In other instances, air circulation between chips has been relied upon for cooling. In some cases, the memory chips have been mounted to heat spreaders which then extend out substantially past the edges of the chips forming larger surfaces from which the heat may be dissipated either by radiation or convection as air passes over the heat spreader extensions.

The more densely populated a memory module is, the more difficult to dissipate any internally generated heat resulting from the normal operation of the memory chips. Not only are the stacked and bonded or cubed memory chips the most efficient from a density standpoint, but also have the shortest read/write power and address lines. Also, they are the most difficult to cool because heat is difficult to remove from the solid cubic memory chip structures.

Examples of prior art which describe and show some of the aspects described above, include Eichelberger, et al. U.S. Pat. No. 5,190,946, which shows chips which have been bonded into a memory cube. The chips rely upon edge contacts exposed through the surface or the edge spaces of the individual chips together with the conductive paths interconnecting those contact points with contact points on other chips or outside the integrated circuit assembly.

Kato U.S. Pat. No. 5,051,865 shows chips bonded together using an adhesive, and then hazing heat sink plates positioned intermediate some adjacent chips to acquire and conduct away the heat.

Fassbender, et al. U.S. Pat. No. 5,019,943, illustrates a stack of integrated circuit chips having connections adjacent at least one edge of the circuit surface of each chip.

Baudouin, et al. U.S. Pat. No. 4,975,763, illustrates metal conductors extended out from a circuit package for surface mounting on a circuit board.

U.S. Pat. Nos. 4,982,264 and 5,059,557 both by Cragon, et al., illustrate circuit chips being attached to a motherboard and connected to conductors on the motherboard by solder connections near the edge of the chip on the circuit face of the chip. Malhi, et al. U.S. Pat. No. 5,031,072 illustrates a plurality of integrated circuit chips inserted into retaining slots in a silicon baseboard and solder connected from contact points on the circuit face near the edge of the chip to contacts on the baseboard.

U.S. Pat. No. 4,983,533 discloses electronic isolation of defective or inoperative circuits on integrated circuit chips and specifically states that this technique is applicable to dynamic RAMs (Random Access Memory), static RAMs and Read-Only-Memory as well as logic units and arithmetic units.

One may appreciate that the assembly of the memory chips, as described above, is a substantial deterrent to easy and economical removal and replacement of defective memory chips where a significant portion of a memory chip is inoperative.

SUMMARY OF THE INVENTION

It is an object of the invention to enhance the testing and replacement of defective memory chips in a memory module.

It is another object of the invention to simplify and ease assembly of memory chips into a memory module.

It is another object of the invention to enhance the cooling of the memory chips within the memory module while at the same time providing an easily handled memory and heat spreader assembly.

It is a further object of the invention to support the capability of assembly and testing without permanent attachment of all memory chips to the memory module.

It will be understood that both the shortcomings and disadvantages of the prior art devices may be overcome in addition to improved cost effectiveness of the manufacture of memory modules by the memory module described herein. The memory module is comprised of a circuit board or substrate which may be flexible and which carries on its surface connection points or contact pads for the power, read, write and address lines of the memory chips.

In order to accurately position the memory chips, a chip holder is precisely located over the circuit substrate. The chip holder typically is provided with positioning slots which will accommodate the heat spreaders. The heat spreaders are bonded or adhesively attached to the circuit chips. The heat spreaders are typically heat conductive metal sheets which have extensions that will slide into the slots of the chip holder and carry the memory chip into the proper location relative to the contact points on the circuit substrate.

The heat dissipation from the heat spreaders is accomplished by contacting a flange on the heat spreader with a common heat sink. The heat sink extends across the flanges of all the heat spreaders in the chip holder and will absorb and dissipate the heat from many of the heat spreaders simultaneously.

Contact between the memory chips and the circuit substrate is effected by clamping the heat sink onto the heat spreader, which in turn forces the memory chip toward the circuit substrate. The memory chip has formed, either near the edge of the circuit face of the chip or on one of the side faces of the chip, a plurality of contact pads which in turn have had deposited thereon a solder compound; and the solder heated or reflowed to form a series of small solder balls bonded to the contact pads and protruding from the chip surface. The solder forms the balls when reflowed due to surface tension of molten solder.

The circuit substrate is provided with a plurality of contacts, corresponding to the contacts and the solder balls on the memory chips. When the memory chips are properly positioned, the solder balls will align with and make contact with the contact pads on the circuit substrate. The contact pads of the circuit substrate preferably will be plated with a palladium or a palladium alloy material in such a way as to create dendritic crystals of palladium or the alloy extending from the surface of the contact pads. Thus, when the solder balls are positioned onto the contact pads, the dendritic crystals will extend upward and into contact with the solder balls, thus assuring a mechanical contact as well as an electrical continuity therebetween. The clamping of the heat sink to the other components of the module and to any supporting motherboard then will force the contact balls into intimate, physical and electrical contact with the dendritic crystals of the plated palladium or alloy, thus assuring reliable electrical contact adequate for testing purposes.

Power distribution is accomplished by the use of power plates which are effectively from a large capacitor. The positive and negative plates of the power distribution apparatus are spaced and insulated from each other. The power conductors of the circuit substrate are effectively vias through the substrate structure from the contact pads on one face to a second contact pad on the opposite face of the circuit substrate. The second contact pad then may make contact with the power plate immediately therebelow and provide the required voltage. Ground connections are provided by vias through the power distribution plate to the ground plate positioned juxtaposed to the power plate and on the opposite side of the power plate from the circuit substrate. The entire assembly may be clamped or bolted to a motherboard not only to provide the required positioning of the module relative to the motherboard but, also, the compressive forces necessary to insure adequate electrical contact between the solder balls of the memory chips and the contact pads of the circuit substrate.

Since only one chip typically is bonded to a single heat spreader, the spacing between the heat spreader and the adjacent chip provides an air passage which may be used to convectively cool the heat spreader, if desired, as an option. With air flow over the heat sink and through the interstices between the chips and the heat spreaders, if needed, the need for cryo-cooling may be avoided.

By utilizing individual memory chips bonded and attached to heat spreaders which are then positioned by the chip holder, manufacturing operations required for memory cubes such as surface grinding of the assembled chips, plating of contact pads on individual conductors exposed by the grinding, disassembly and potential destruction of good memory chips during repair and re-work of the assembled memory cubes are eliminated resulting in significant advantages to the present invention.

The compressive force contact between the solder balls and the contact pads on the circuit substrate permit the relatively easy removal and replacement of defective memory chips following testing. If desired, after the memory module has been tested and determined to contain at least an acceptable amount of operable memory, the solder balls on the memory chips may be reflowed to permanently attach the solder connection to the circuit substrate contact pads. Such a memory assembly is readily removable and replaceable within the computer structure should it become necessary without the need for extensive disassembly and re-work.

It is to be appreciated that a more detailed understanding of the invention may be acquired from the drawings and the detailed description to follow.

DRAWINGS

FIG. 9 illustrates a chip holder with openings for chips extending along the length of the holder.

FIG. 16 is an enlarged view of a portion of heat spreader slots and memory chip opening of the chip holder in FIG. 9

DETAILED DESCRIPTION OF THE PREFERRED EMBODIMENT OF THE BEST MODE CONTEMPLATED BY THE INVENTOR FOR CARRYING OUT THE INVENTION

Figure 1:
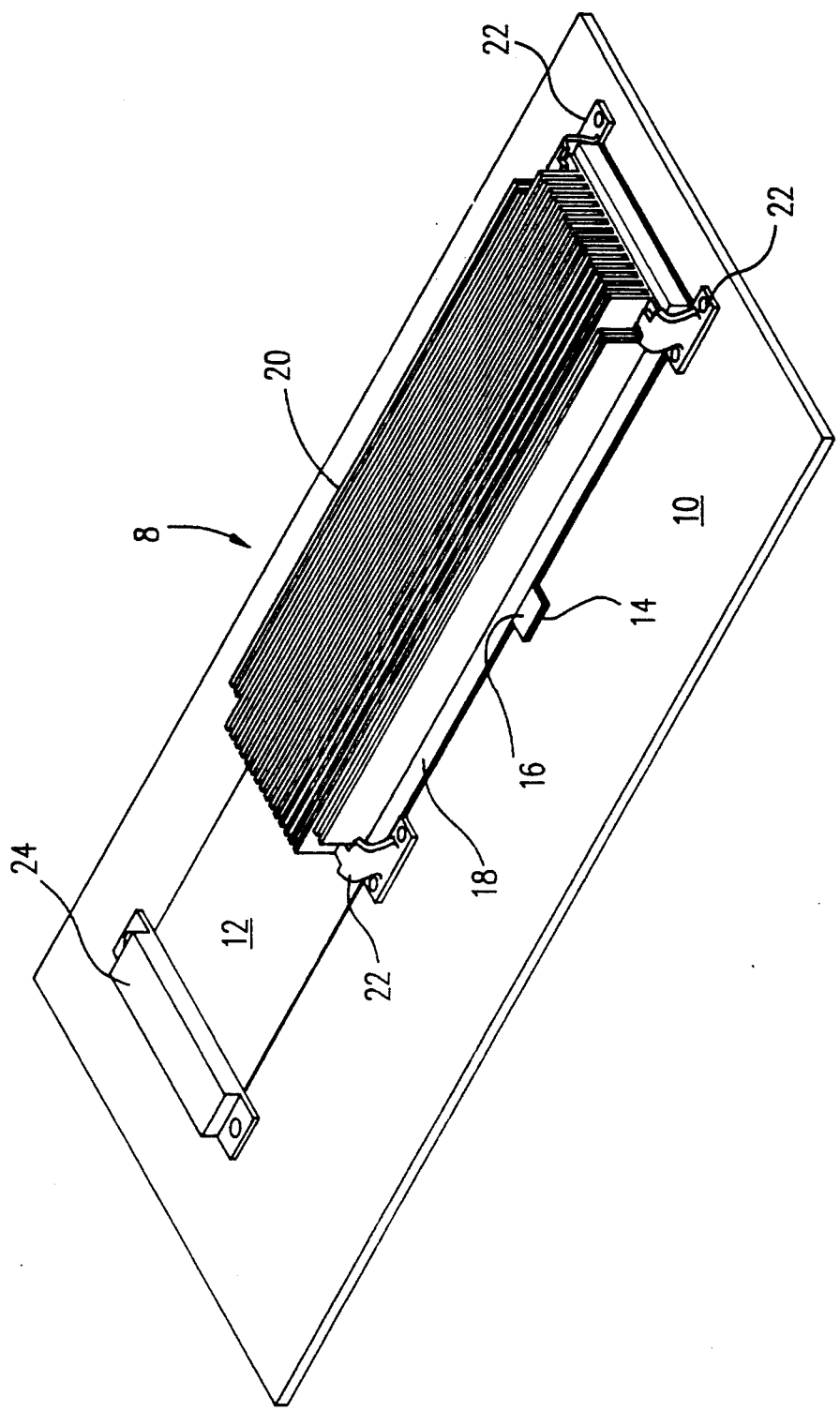
FIG. 1 illustrates the memory module assembled and clamped to a motherboard.
Figure 15:
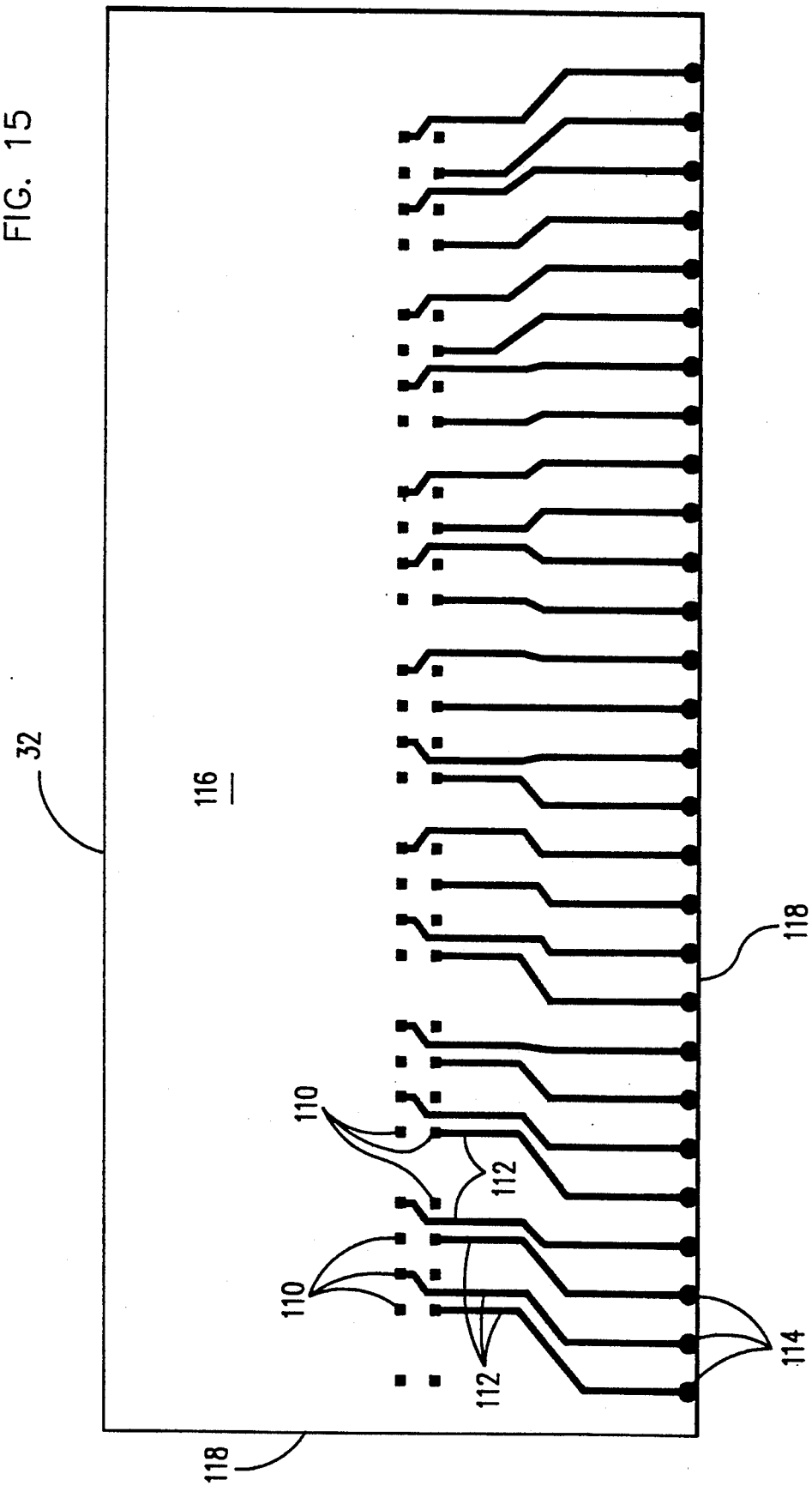
FIG. 15 is an example of the wire bond pads, lands and contact pads on a memory chip.

FIG. 1 illustrates an electronic circuit board 10 referred to as a motherboard 10 which, in turn, supports the memory module 8 of this invention. The memory module 8 is positioned and retained on the motherboard 10 so that the appropriate electrical power and control connections may be made to memory module 8. Overlying motherboard 10 is an electrical circuit substrate 12. The electrical circuit substrate 12 is flexible circuit board with conductive patterns formed in and on the substrate structure 12 with exposed contact pads (not shown) on the upper surface of the circuit substrate 12. The electrical contact pads 91, 93 are precisely located so that when the entire memory module 8 is assembled, the memory chips 32 will make appropriate contact between memory chip contacts 38 and the contact pads 91, 93 of the circuit substrate 12 as will be more thoroughly discussed later. Contacts 91 and 93 are power contacts. Contacts 94 are also illustrated for connections to the control connections of the memory chips 32, but are largely omitted for clarity. The connections 94 would be placed as required by the contact pad 114 arrangement and signal assignment on chip 32 as shown in FIG. 15 to be discussed later.

The contact pads 114 and connections 91, 93, 94 will be described below in reference to FIGS. 2, 3, 4, 5 and 15. Intermediate the circuit substrate 12 and motherboard 10 is a power distribution system comprised of power distribution plate 15 and power return plate 17 illustrated in FIG. 2 with the connection tabs 14 and 16 extending from the plates 15, 17 and outside the confines of memory module 8.

The power distribution assembly plates 15 and 17, together with connection tabs 14 and 16, efficiently connect a power source, not shown, to the multiplicity of memory chips 32 contained within the memory module 8.

Overlying the circuit substrate 12 is a chip holder 18. The chip holder 18 holds, retains and positions the memory chips 32 in precise spatial relation with respect to the circuit substrate 12. A heat sink 20 is placed upon the top of the assembled parts and engages its lower surface with the heat spreaders 30 which are used to further position the memory chips 32 and conduct the heat from the memory chips 32 to the heat sink 20. More detailed discussion of these elements will follow.

Clamp members 22 are attached to motherboard 10 and engage heat sink 20 to provide a clamping and retaining function, thereby holding the memory module 8 in its assembled state and accurately positioning it with respect to the motherboard 10.

The circuit substrate 12 is provided with electrical contact pads 36 on the underside, best seen in FIG. 2, which will be described in more detail later, but which pads 36 will engage the motherboard 10 and corresponding contact pads 34 thereon. Clamp 24 functions to force the contact pads 36 of circuit substrate 12 into engagement with corresponding contact pads 34 on motherboard 10 to complete the electrical connections.

Figure 2:
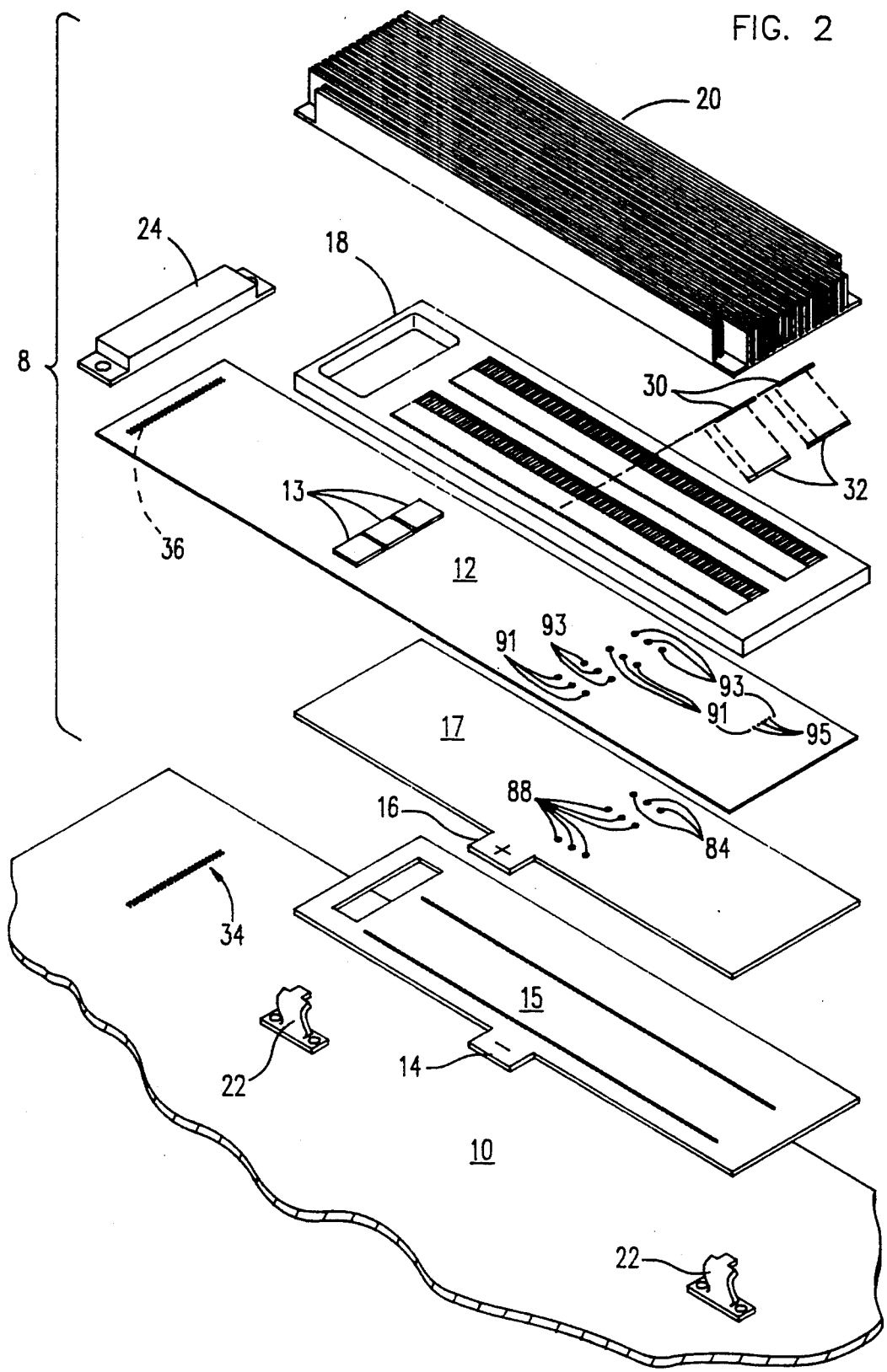
FIG. 2 illustrates the memory module in an exploded view.
Figure 3:
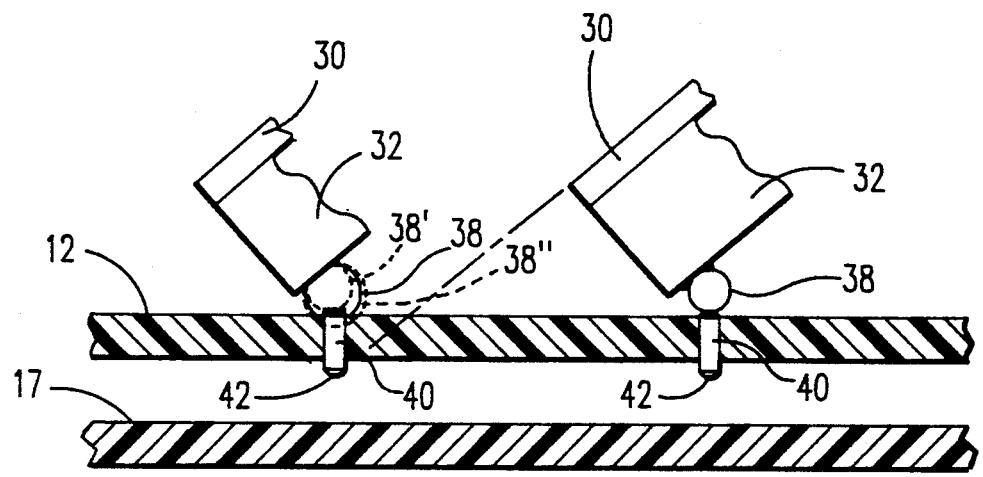
FIG. 3 shows two adjacent memory chips in contact with the circuit substrate and positioned over the positive plate of the power distribution assembly.
Figure 4:
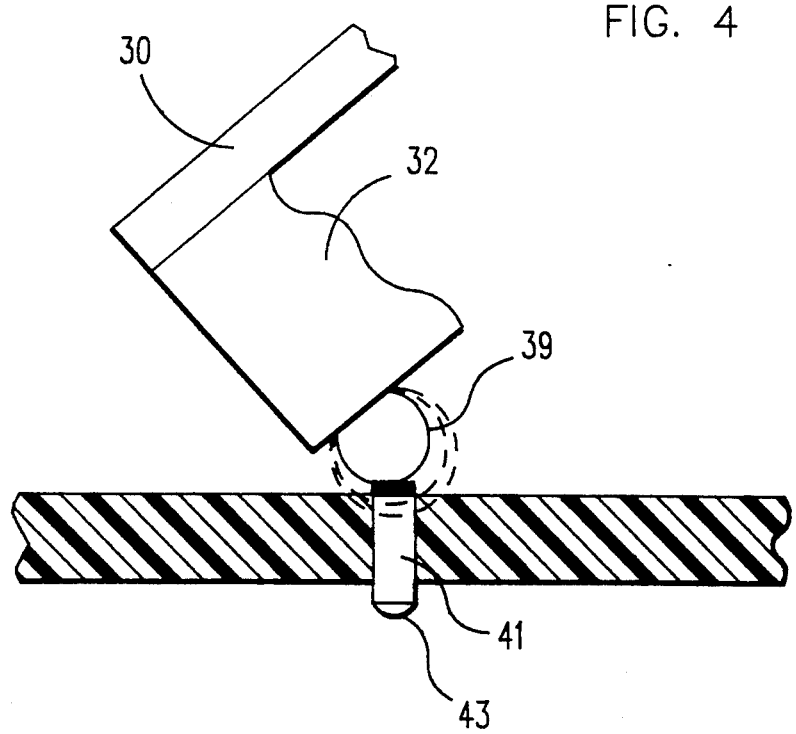
FIG. 4 shows the solder ball connection with the memory chip and the dendrite crystals of palladium.

FIG. 2 is an exploded view of the memory module 8 illustrating more details of the components of the memory module 8 illustrated in FIG. 1. The motherboard 10 carries electrical circuit patterns which are determined by the computer circuit designer to connect not only the circuit substrate 12 and the memory module 8 to the computer, but also to provide other input/output and control paths necessary for the proper and efficient operation of the computer system. The motherboard 10 may be made by any conventional technique so long as it is provided with contact pads 34 on the upper surface which may be engaged by the memory module 8 in order to provide data paths and control paths to and from the memory module 8.

Due to the large number of electrical connections 34, 36 that may need to made between the motherboard 10 and the circuit substrate 12, a preferred embodiment of the best mode is to form a pattern of contact pads 34 on the upper surface of motherboard 10 in an array, such as the contact pads illustrated at 34. The contact pads 34 may preferably be blind vias which have holes extending part way through the motherboard and which are filled with an electrically conductive metal alloy such that they project slightly above the surface of the motherboard 10. The details of fabrication of the contacts 34 and contacts 36 will be discussed with respect to FIG. 7 below. Suffice it to say at this point that the contacts 34 and 36 may be precisely aligned with each other and then forced into physical and electrical contact by the use of a retainer or other suitable clamping member 24 to hold the contacts 36 against contacts 34, thereby establishing electrical continuity.

Figure 8:
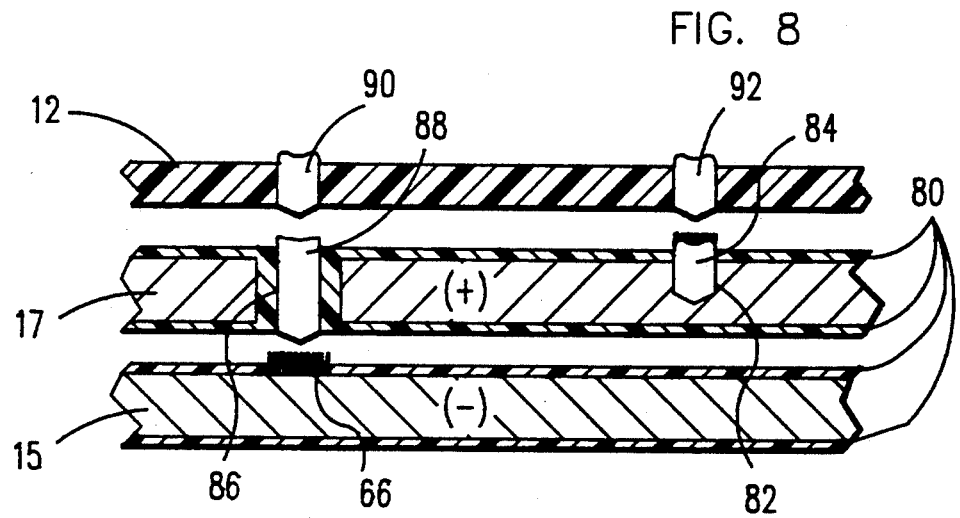
FIG. 8 is an exploded sectional view through the circuit substrate and the power distribution assembly.

Now, discussing the details of the power distribution assembly 15, 17 as can best be seen in FIG. 8, a plate 15 is insulated except at regions 65 or areas where electrical contact must be made in order to isolate the plate from motherboard 10 and from plate 17. Plate 15 is provided with a power connection tab or terminal 14, as seen in FIG. 2, to permit the supplying of a negative voltage potential to plate 15 through any suitable connector.

Power distribution assembly plate 17 is similarly provided with a power connection 16, as seen in FIG. 2, in the form of a tab 16 and plate 17 is likewise insulated except with regard to specific areas where contact must be made in order to avail the contacting device with a power connection.

The two plates 15, 17 are placed in a juxtaposed position with at least the insulation of one of the plates between the two plates 15, 17 forming a capacitor. The low inductance of the capacitor serves to increase the ability to obtain high speed or short cycle response times in the memory module 8.

The details of construction of the power distribution assembly 15, 17 comprising plates 15 and 17 is best illustrated in FIG. 8 which shows the interconnections and contacts for the distribution of power to the logic chips 13 and to the memory chips 32 of the memory module 8 shown in FIG. 2. Plate 15 and plate 17 are provided with insulative layers 80 on the surfaces thereof to effectively isolate one plate from the other and prevent short circuits therebetween. The insulation layers 80 further act as capacitive insulation to form a low inductance capacitor along with plates 15 and 17.

The negative potential plate 15 remains exposed in selected regions and dendritic crystals 50 of palladium or other suitable plating metal are formed in the openings of the insulative layers 80. The dendritic crystals 50 act to form a yielding physical or mechanical contact with any electrical contact, such as a solder ball 38 shown in FIG. 5, forced into engagement with the crystals. Power distribution plate 17 carrying a positive potential likewise is insulated on all surfaces including the interior surfaces of any holes 86 which are formed through plate 17 to accommodate vias 88 extending through the plate 17. Additionally, the insulative layers 80 on plate 17 may be interrupted and blind vias 87 formed into plate 17 to accept a conductive material to form a contact pad. The blind via hole 82 is filled with a material 84 such as copper, or the like and then plated with palladium to form dendritic crystals 50, as previously described. The complete via holes 86 are filled with electrically conductive material identical to that filling the blind via hole 82 to form a conductive via path 88 from one surface of plate 17 through the plate 17 and to the other surface thereof.

When properly aligned and when compressed against plate 15, the via path 88 will, engage dendrite crystals 66 or 50 creating an electrical power path from plate 15 through crystals 66 and via 88 to the top surface of insulated plate 17. Circuit substrate 12 is illustrated as overlying the top surface of plate 17 in such an alignment that a via 90, fully analogous to via 88, extending through the insulation material of circuit substrate 12, may be engaged with the via 88 to provide a further portion of the electrical power path from plate 15 through via 88 and via 90 to the top surface of the circuit substrate 12. Via 92 constructed identically to via 90 will, when properly positioned, align and contact with the blind via 84 in plate 17 thereby providing a power connection from plate 17 through blind via 84 and via 92 to the top surface of the circuit substrate 12.

Referring again to FIG. 2, the top surface of circuit substrate 12 will be provided with a plurality of connections and contact pads 91 and 93, 94 which are the top surface of the vias, 90, 92 respectively, only a few of which are shown for clarity. It is to be understood that the vias 90 and 92 together with the vias 88 and blind vias 84 shown in plate 17 are positioned as dictated by the arrangement of the memory chips 32 above the circuit substrate 12.

Figure 6:
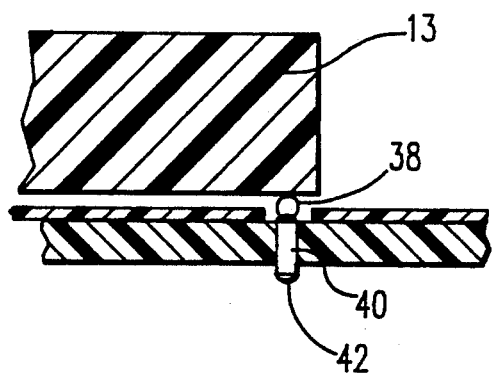
FIG. 6 illustrates a planar chip mounting approach.
Figure 7:
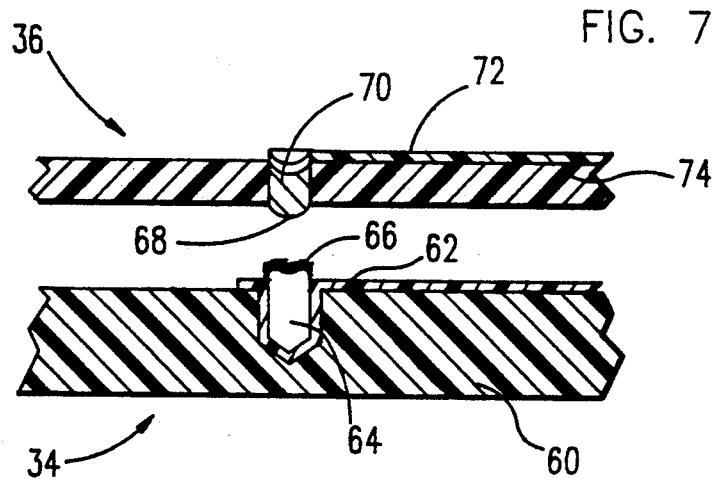
FIG. 7 is a sectional view through a contact pad on the circuit substrate and on the motherboard.

Logic chips 13, for the control of reading from and writing to the memory chips 32 may be surface mounted on the circuit substrate 12, as shown in FIG. 6, in any desired manner; but the preferable process uses solder balls 38 formed on the contact pads, not shown, of the logic chips 13 and positioned on top of contact pads analogous to the blind via 64 in FIG. 7 or via 40 in FIG. 6 in contact with the dendritic crystals 50 on the top surface of via 64 or 40, with the solder balls 38 being reflowed to create a permanent attachment of the logic chip 13 to the circuit substrate 12. Retainer 24 is a clamping bar, shown in FIG. 2, suitably insulated to prevent any effect on any of the circuits on circuit substrate 12 or any of the contacts 36, and is utilized to hold contacts 36 in contact with the contacts 34 on the motherboard 10.

A chip holder 18 is then placed on top of and precisely positioned relative to the circuit substrate 12. The chip holder 18 is preferably fabricated from a low tolerance plastic and molded to provide at least one and preferably a plurality of openings 94 into which memory chips 32 may be positioned. For more details of the chip holder 18, refer to FIGS. 9, 10 11 and 12. Chip holder 18 in the illustrated embodiment is formed with two memory chip openings 94. A third opening 96 is provided to allow the chip holder 18 to be positioned over and surrounding logic chips 13 or associated other circuitry on circuit substrate 12. Opposing walls 98 of openings 94 are interrupted on a periodic basis by slots or channels 100 formed to permit the insertion of a thin flat member bridging the opposing walls 98. The slots 100 may be oriented either perpendicular to or at any of various angles with respect to the large plane surface 95 of the chip holder 18.

Figure 17:
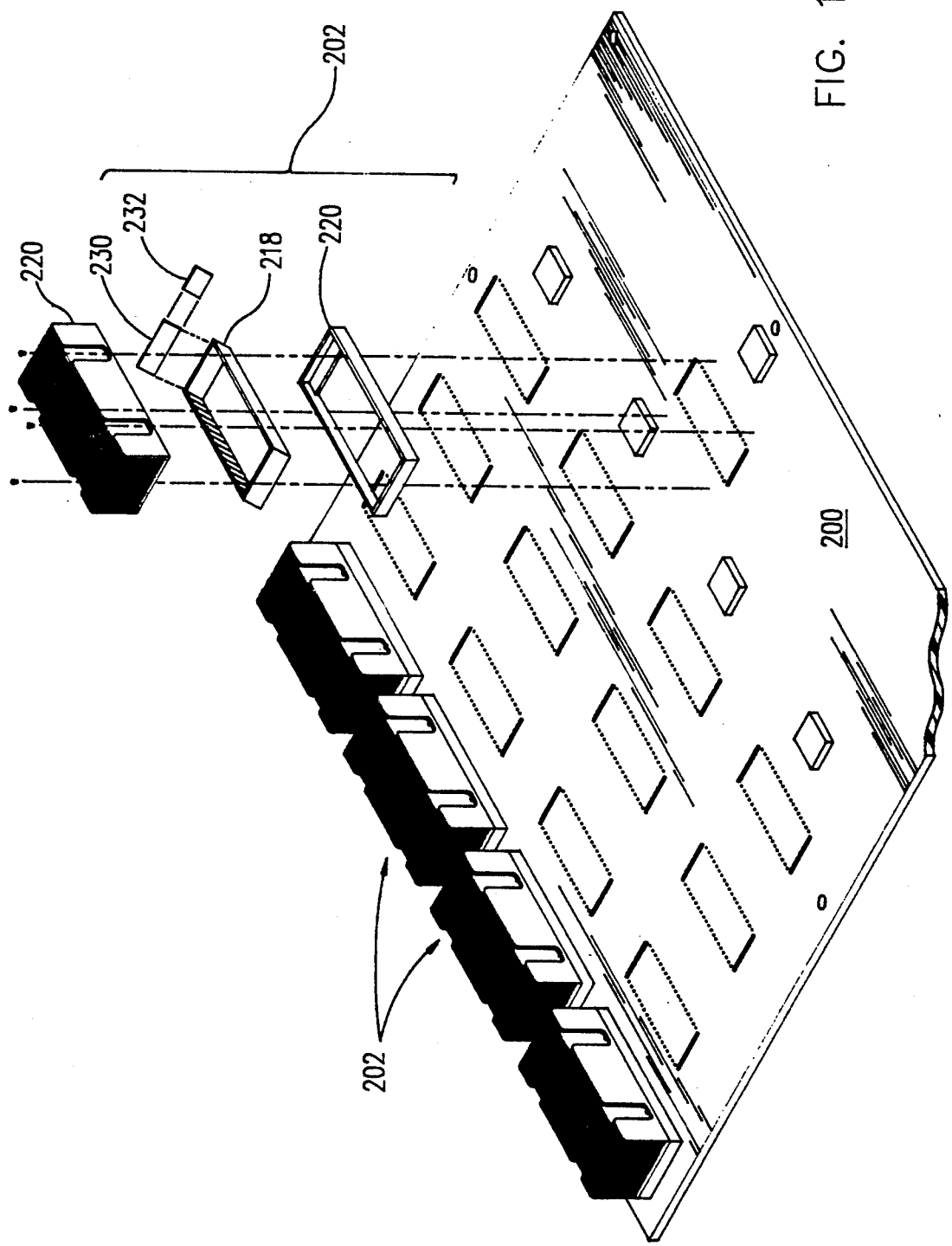
FIG. 17 illustrates a view of a single motherboard with segmented chip holders attachable thereto to allow memory expansion as needed.

Should the system use memory in varying amounts and have the potential for requiring additional memory capacity in the future, smaller ship holders may be fabricated and attached to a motherboard 200, shown in FIG. 17. The memory assemblies 202, each comprising a chip holder 218, a positioner 230, heat spreader 230, memory chips 232 and heat sink 220. As memory requirements, additional assemblies 202 may be assembled and attached to the motherboard 200.

The orientation of slots 100 will be determined to some extent by the location of the contact pads 114 on memory chips 32. More detail on the contact structure of memory 32 will follow.

Memory chips 32 which are conventional memory chips of varying capacities and sizes, with all contact pads 114 along one edge of the chip substrate, are provided and attached by a thermally conductive glue or solder to copper plates 30 which serve as heat spreaders 30 and supports for the memory chips 32. Each heat spreader 30 is typically provided with a lip or flange 31 formed or bent at an angle to the main portion of heat spreader 30 to engage with and transfer heat to heat sink 20. Heat spreader 30 should be of a material that is thermally compensated to match silicon. By thermal compensation, the heat spreader 30 will have a thermal coefficient of expansion approximately equal to that of silicon, the material of chips 32.

Figure 14:
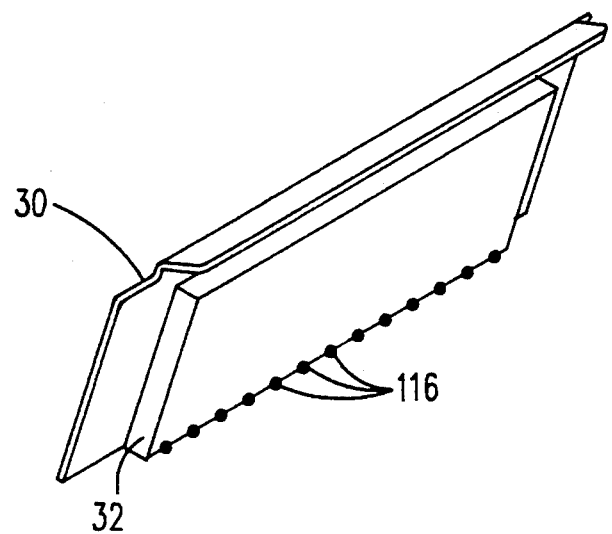
FIG. 14 is an assembled view of the components in FIG. 13.
Figure 13:
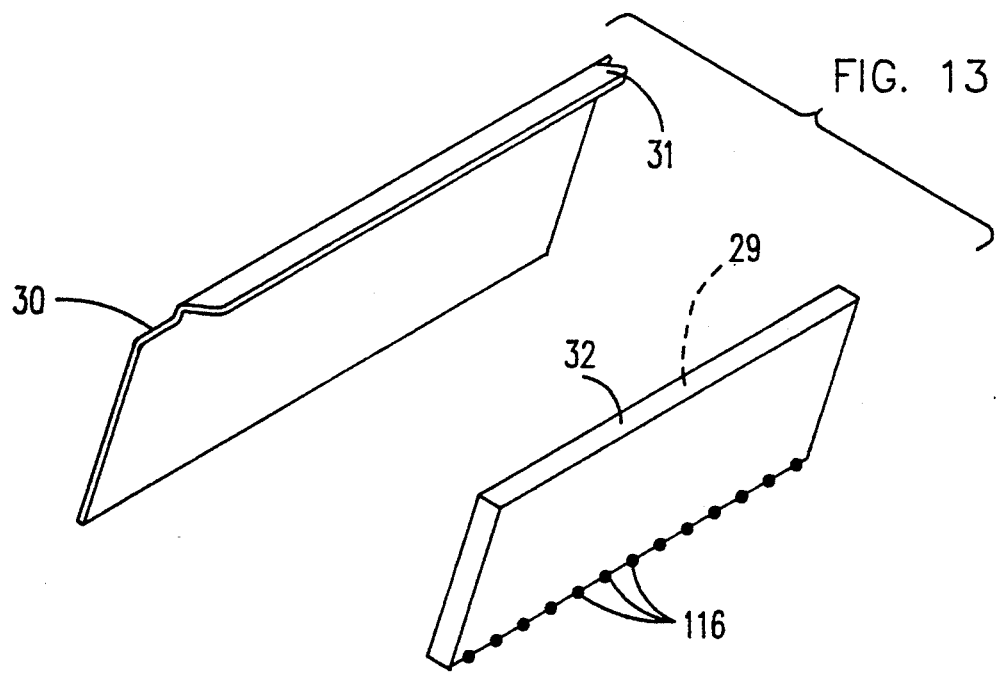
FIG. 13 is an exploded view of a heat spreader and memory chip.

Referring to FIGS. 13 and 14, the heat spreader 30 and memory chip 32 are illustrated in an exploded and assembled view, respectively. The memory chip 32 may be mounted on heat spreader 30 using a thermally conductive glue or cement which not only functions to attach the chip 32 to spreader 30 but also is highly heat conductive and, therefore, is efficient in transference of the heat from chip 32 to the heat spreader 30. Heat spreader 30 preferably is fabricated from a copper-INVAR-copper (CIC) sheet. CIC is preferable due to cost, CIC's ability to be attached readily by soldering if desired, and CIC is very highly heat conductive and thermally compensated to silicon. Other composites such as Aluminum-INVAR-Aluminum or INVAR alone can be used for the spreader 30. The copper is preferred due to its slow oxidation rate and high electrical conductivity. The electrical conductivity helps with grounding or shielding of the chips.

Because of the requirement for precise alignment of the memory chips 32 with the contact pads, for example, power connections 91, 93 on circuit substrate 12, the positioning of the chip 32 relative to heat spreader 30 is an operation which requires precision. The chip 32 may be positioned relative to the heat spreader using precision fixtures during attachment.

Should there be a desire to attach the chip 32 to spreader 30 by soldering, it is first necessary to plate the non-circuit face 29 or bottom surface 29 with copper or other readily solderable wettable metal. After face 29 has been prepared in such a manner, then soldering of the chip 32 to heat spreader 30 is a conventional solder operation and provides an excellent heat transmissive mounting of chip 32. The heat spreader 30 and chip 32 must be precisely held during this operation relative to each other.

The flange 31 on heat spreader 30 may be formed at an angle which will provide a slight springing action when engaged by heat sink 20, thereby assuring physical contact between flange 31 and heat sink 20.

Additionally, an indium foil or other highly deformable, but heat transmissive material such as a commercial product known as Thermostrate, may be interposed between heat sink 20 and flange 31 to enhance heat transfer. Thermostrate is available from Power Devices, Inc. of Laguna Hills, Calif. Heat transfer without the thermally enhanced connection between flange 31 and heat sink 20 may be adequate for smaller memory chips 32 which occupy only a small portion of the surface of heat spreader 30. The thermally enhanced connection may be required when larger capacity and, therefore, higher heat generating chips 32 are used in the memory module 8.

Once the memory chip 32 is precisely mounted on a surface of heat spreader 30, a plurality of heat spreaders 30 may then be inserted into the slots 100 of chip holder 18. With chip holder 18 precisely positioned relative to the contact pads 91, 93 on the top surface of circuit substrate 12, the memory chips 32 will then be appropriately and precisely positioned relative to the contact pads 91, 93 on circuit substrate 12 and thereby be readily connectable to the circuitry necessary for utilizing the memory chips 32.

Heat sink 20 and any thermally enhancing interface material such as indium foil or Thermostrate may then be positioned over the chip holder 18 and the clamping of the entire assembly accomplished by a number of possible techniques. Illustrated in FIG. 2, are clamp members 22 which will engage and hold heat sink 20 and the other related pieces of the memory module 8 onto motherboard 10. The mounting of clamps 22 may be accomplished in any of several different ways; but if screws or bolts, not shown, are used, a controllable force may be exerted through clamp 22 onto the heat sink 20 and thereby onto memory module 8.

Alternatively, heat sink 20 could be provided with holes, not shown, aligned with holes in the other elements of the module 8 and thereby screwed or bolted to motherboard 10 or other suitable mounting member.

The contacts 114 on memory chip 32 supporting solder balls 38 are forced toward the corresponding contact pads 91, 93 on circuit substrate 12 whereby the electrical connection between the chips and the circuitry of circuit substrate 12 are accomplished.

To better understand the connection techniques which are highly useful with this assembly, please refer to FIG. 3, 4, 5, 6 and 15. In FIG. 15, a memory chip 32 having a pattern of wire bond pads 110 thereon is illustrated. A plurality of conductive lands 112 are deposited on the surface of the chip structure. These lands 112 extend from the wire bond pads 110 to contact pads 114 which are adjacent the edge of the planar surface of the chip 32.

For purposes of description, the following convention will be adopted for this specification. The surface of the silicon slab on which electrically active circuit elements are deposited and fabricated and which is generally one of the larger planar surfaces of the silicon body will be referred to as the circuit surface. The surface of the silicon slab on which the chip is fabricated, which has no electrically active electrical elements formed or deposited thereon will be referred to as the bottom surface or bottom face. The bottom surface and the circuit surface of a memory chip will generally be parallel to each other. Those remaining surfaces, generally narrow and extending between and connecting the circuit surface and the bottom surface, shall be referred to as edge surfaces and may or may not have electrical contacts or electrically conductive paths deposited on or formed onto the edge surfaces.

The conductive lands 112 in FIG. 15 may be deposited upon the circuit face 116 of the memory chip 32 using conventional semi-conductor manufacturing techniques or, alternatively, may involve only the use of a conventional plating or inconventional vapor deposition of metal onto the circuit surface 116 of chip 32 and removal of a mask material to leave only the desired land patterns.

Likewise, the pads 114 may be formed in an analogous manner or using the same process and formed simultaneously with lands 112.

After the pads 114 are formed on the circuit face 116 of memory chip 32, solder alloy may be plated or vapor deposited onto the exposed pads 114 through holes in a mask which leaves mask apertures in registration with the pads 114. Upon the completion of the solder deposition, the masking material is removed typically leaving small cylinders of solder extending away from the circuit surface of chip 32. The chip 32 and the solder cylinders then are heated to above the melting point of the solder alloy resulting in the formation of balls 38 or spheres 38 of solder resting on the pads 114. The resulting solder balls 38 may be seen in FIG. 3 or FIG. 5 protruding from the circuit face 116 of memory chip 32 in each of these figures.

The spheres 38 or balls 38 of solder are shaped due to the surface tension of the liquid solder after it has been heated to above the solder's melting point. The size of the apertures in the mask material and mask thickness may be precisely controlled and, therefore, the volume of solder available to form a solder ball 38 on each pad 114 will result in a ball of a precise volume and precise diameter. Therefore, a mask having consistently uniform aperture sizes will produce solder balls 38 of substantially identical diameter on each pad 114. Once the solder balls 38 have cooled and solidified, the memory chip 32 is ready for attachment to the heat spreader 30 illustrated in FIGS. 13 and 14 and insertion into the chip holder 18.

Figure 5:
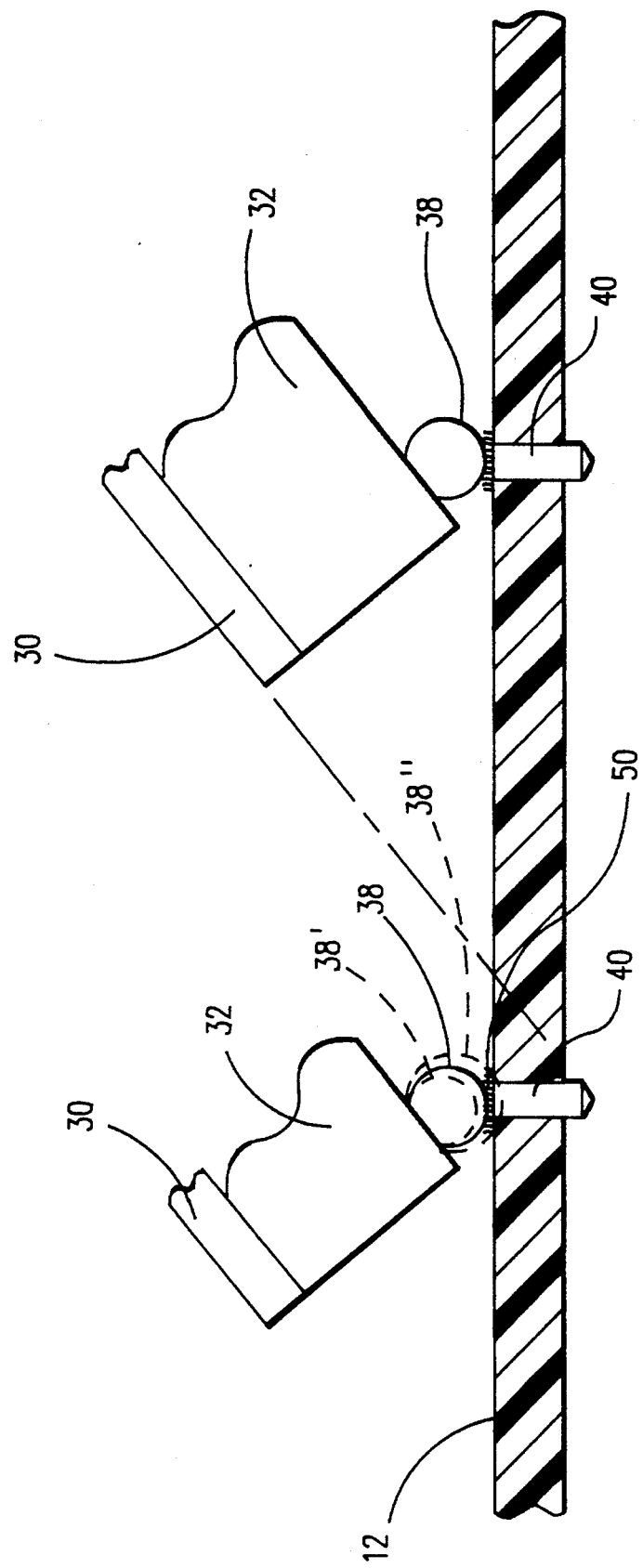
FIG. 5 illustrates a variety of solder ball sizes and relations to the dendrite crystals.

To further understand the contact mechanism between chip 32 and contacts 91, 93, in the form of either vias or blind vias in circuit substrate 12, reference is made again to FIG. 5. FIG. 5 illustrates chip 32 and heat spreader 30 joined together with a solder ball 38 attached to the circuit face 116 of chip 32. Also illustrated are solder balls 38 and 38'' which merely indicate a variation in the diameter of the solder ball 38 which may be accommodated in this connection technique. Via 40 is illustrated as a via passing completely through circuit substrate 12. However, blind vias or surface contact pads may be substituted therefore, where appropriate. In this case, via 40 would be a power connection extending completely through the circuit substrate 12. On the top surface of via 40, a dendritic crystal structure 66 is deposited. The depositing of the dendrites or dendritic crystals 50 is accomplished by plating a suitably electrically conductive material, such as palladium, using a current which is in excess of that which will create a smooth uniform finish. When excessive current is utilized, crystals 50 form but do not form regularly, but rather form dendrites of the material. The dendritic crystals 50 will provide adequate electrical paths between the via 40 and the solder ball 38 for powering the chip 32, writing to or reading from memory locations on the memory chip 32 or controlling the addresses of the memory locations being accessed for either reading or writing.

Since the solder ball 38 is firmly attached to the pad on circuit surface 116 on chip 32, a force biasing the heat spreader 30 and chip 32 in a generally downward direction or at least a direction having a downward component of force, will forcibly engage the solder ball 38, 38' or 38'' with the dendritic crystals 50 of the crystalline connecting structure 66 establishing electrical continuity.

It should be understood that while the preferred embodiment and best mode contemplates the use of solder balls 38 formed on the circuit face 116 of the memory chip 32, it is also recognized that the conductive patterns or lands 112 of FIG. 15 may be extended over the edge of the circuit face 116 onto one of the edge face 118; and the solder balls 38, 38' or 38'' then could be formed on contact pads 91, 93 analogous to pads 114 positioned on the edge surface 118 of memory chip 32.

Should the contacts 114 and solder balls 38 be formed and positioned on an edge face 118 of memory chip 32, then the angle between the slots 100 and the top surface of circuit substrate 12 may be increased to 90 degrees in order to improve contact between the solder ball 38 and the dendritic crystals 50 deposited on the appropriate and corresponding contact pad and memory density within the module 8 would be increased.

From the foregoing description, one of skill in the art will readily appreciate that the power distribution assembly plates 15, 17, the circuit substrate 12 and chip holder 18 may be assembled and loaded with heat spreaders 30 carrying memory chips 32. The entire assembly 8 then may be clamped together using the heat sink 20 as a top retaining member and appropriate connections made with the contacts 36 on the circuit substrate 12. With appropriate conventional test equipment, the memory in the memory chips 32 may then be tested and any faulty memory identified. In the event that a particular chip 32 is determined to be sufficiently faulty to require replacement, the removal of the heat sink 20 from the assembly 8 will expose the flanges 31 of heat spreaders 30. The heat spreader 30 carrying the defective chip 32 then may be located and withdrawn from the chip holder 18, and another chip 32 and heat spreader 30 inserted in its place. Upon re-testing, if the memory inserted into the chip holder 18 proves to be satisfactory by whatever standards are established, then the entire device may be clamped to a motherboard for subsequent assembly into a computer or similar device.

Since memory testing equipment typically can identify the extent of the defects within any particular segment of memory, it is possible to withdraw the defective memory chip 32 from chip holder 18 and to sort it with regard to the amount of operable memory remaining on the chip 32. At this point the chip is exposed and not encapsulated or permanently contained in a frame thereby aiding any required re-work. Thus, it is possible to preserve partially operable memory chips 32 for future use in environments and memory modules 8 having a lower criteria for operability or where smaller quantities of memory are required.

If the memory module 8 is going to be used in an environment requiring permanent connections between the chips 32 and the contacts on the circuit substrate 12, the solder balls 38 then may be reflowed a second time, which will result in the wetting of the dendritic crystals 50 with the molten solder and the permanent fusing of the chip 32 by means of the solder joints to the contact pads 91, 93 on the circuit substrate 12.

It is readily appreciated that this memory module 8 permits assembly, testing and re-work without the potential to destroy the circuit substrate 12 or other portions of the memory module 8 or to destroy or adversely affect otherwise good memory chips 32 during assembly, test and re-work procedures.

This memory module 8 further provides flexibility with respect to determination of the type of connection between the memory chip 32 and the circuit substrate 12 in that the assembly may rely totally upon forceable engagement of the solder balls 38 with the dendritic crystal structure 66; alternatively, the solder balls 38 may be reflowed to fixedly attach the chips 32 in electrical continuity with the circuit substrate 12. The circuit substrate 12 is typically a multi-layer flexible circuit structure which may be manufactured by any one of several known techniques. The preferred and best technique is that disclosed and described in U.S. patent application Ser. No. 07/724,245 titled HIGH DENSITY SUBSTRATED DESIGN AND MANUFACTURING PROCESS by R. F. Frankeny et al and now U.S. Pat. No. 5,146,674.

To further enhance the positioning of the contact pads 114 on memory chip 32 with respect to and relative to the contact pads, for example 91 and 93 on circuit substrate 12, it may be necessary to improve the positioning of the heat spreader 30. Since extremely fine manufacturing tolerances may not be maintained when molding plastics, the chip holder 18 may not provide by itself adequate accuracy for positioning.

Figure 10:
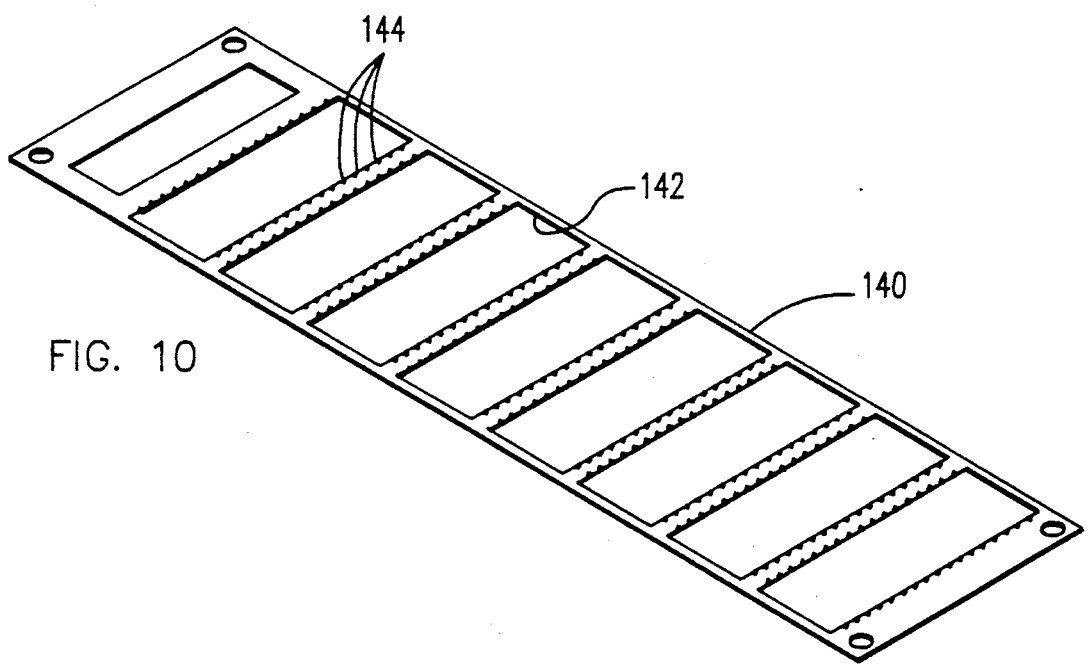
FIG. 10 illustrates a chip holder locator plate with openings extending across the chip holder.

A solution to this problem is illustrated in FIG. 10, wherein a positioning plate 140 is fabricated by first forming a plurality of apertures 142 into plate 140. After the apertures 142 have been formed by such techniques as either etching or stamping, precision located notches 144 may be formed in opposing edges 141 of apertures 142. In FIG. 28, the orientation of the apertures correspond to the openings 150 in chip holder 160 shown in FIG. 12. In chip holder 160, the slots 110 are formed into the opposing walls defining apertures 150, in a manner identical or analogous to the formation of the slots 100 illustrated in FIG. 9.

The notches 144, shown more clearly in FIG. 16, are formed by etching the metal which forms the locator plate 140. The etching of the locator plate 140 will leave a notch 144 which has sidewalls inclined approximately 5 degrees away from the perpendicular, thereby forming a wider mouth to notch 144 on one surface of the locator plate 140 with locator plate 140 positioned with the wider notch mouth of 144 to receive the heat spreader 30. When the edge of heat spreader 30 is engaged with the locating notch 144, the memory chip 32 and solder ball 38 will extend through the aperture 142 to engage solder ball 38 with dendritic crystals 50 on circuit substrate 12, as shown in FIG. 11.

Figure 11:
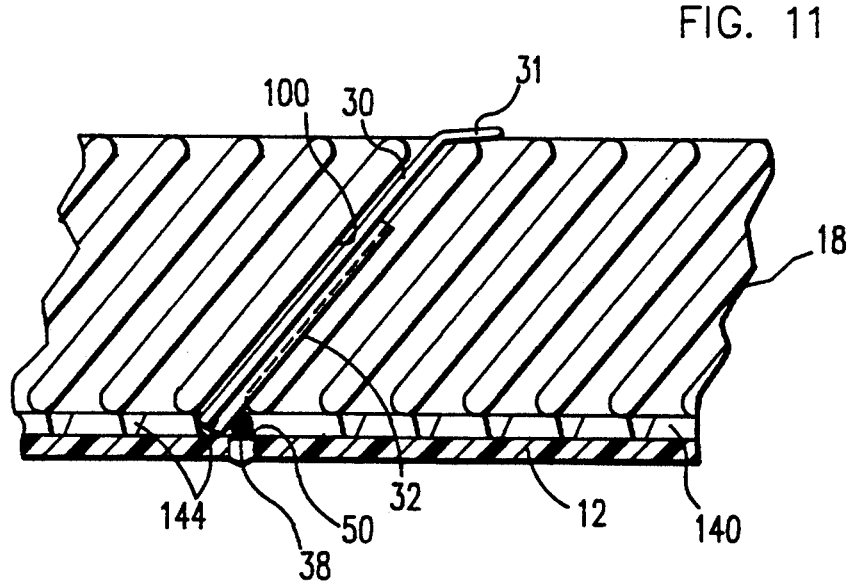
FIG. 11 is a side sectional view of the circuit substrate, chip holder, locator plate, heat spreader and memory chip.
Figure 12:
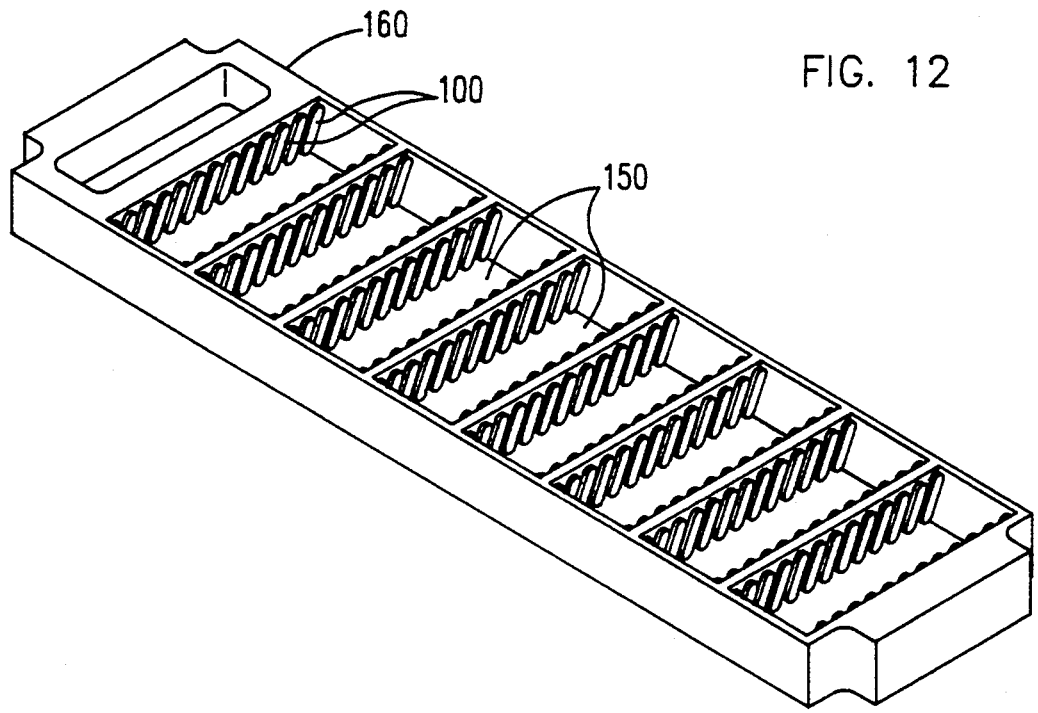
FIG. 12 illustrates a chip holder for use with locator plate of FIG. 10.

In FIG. 11, the via 38 has a depth sufficient to extend all the way through the circuit substrate 12 and thus illustrates a power connection to the chip 32. However, it should be understood that the via 38 could be replaced with a blind via such as the blind via 82 in FIG. 8 to connect to an internal land within the circuit substrate 12.

Circuit substrate 12 may be manufactured using the methods identified above and then plated with palladium onto the exposed contact surfaces 36, 91, 93 to create the dendrite crystals 50 for contact with the solder balls 38. Alternatively, other conventional circuit board manufacturing techniques may be utilized where the circuit lands may be plated and etched on a conventional flexible circuit substrate.

The description of the method of manufacture contained in U.S. patent application Ser. No. 07/724,245 titled HIGH DENSITY SUBSTRATE DESIGN AND MANUFACTURING PROCESS by R. F. Frankeny et al. and now U.S. Pat. No. 5,146,674, describing the manufacturing or fabricating of circuits suitable for use in the circuit substrate 12, is incorporated by reference herein for purposes of best mode disclosure.

While the chip spreaders 30 and the chips 32 are illustrated as being oriented on an angle with respect to the circuit substrate 12, it should be recognized that they may be positioned at right angles or such that the plane of the chip 32 will intersect the plane of the circuit substrate perpendicular to one another, should space constraints dictate. The vertical orientation is advantageous from a volume standpoint; however, this orientation is disadvantageous from a cost and yield point of view. The slanted orientation of the chips 32 permits the use of chips 32 manufactured with the present technology by which most chip manufacture occurs, that being the technology which yields the contact pads 114 on the circuit face 116 of the memory chip 32.

With the cost and reliability limitations inherent in attempting to route the conductive paths 112 onto the edge faces 118 of the chips 32, and the potential loss in reliability due to the added manufacturing steps and the difference in the coefficient of expansion between the chip 32 and the conductive lands 112 and contact pads 114, the best mode contemplated for implementing the invention is that where the chips 32 are oriented at an angle to the circuit substrate 12, thereby permitting solder ball connections between two surfaces on intersecting planes which have an acute angle there between.

With respect to the choice as to the location of the solder balls, the present technology available for forming dendrite crystals 50 indicates that the dendrite crystals 50 are more inexpensively formed on the circuit substrate 12 than on the individual contact pads of the memory chips 32. When considering the costs of the relative operations, the best mode and preferred embodiment is to place the solder balls 38 on the contact pads 114 of the memory chips 32 and the dendrite crystals 50 on the contact pads 36, 91, 93 of the circuit substrate 12.

The assembly of the respective layers of the module 8 as illustrated in FIG. 2, is accomplished by using adhesives, preferably pressure sensitive adhesives, between the circuit substrate 12, chip holder 18 (whether or not using locator plate 140) and heat sink 20. The power distribution board assemblies 15 and 17, form the base or initial working structure upon which the circuit substrate 12 is fabricated and, therefore, is a portion of the completed circuit substrate 12.

The pressure sensitive adhesives permit the placement of parts relative to each other, alignment between them, and then the forceable engagement of adjacent elements to adhere them to each other thereby holding the assembly in its assembled form for testing and subsequent installation.

The memory arrangements shown and described may be used to meet the memory requirements of computers which are presently satisfied by DRAM's, SRAM's, VIDEO RAM, individual chips and the like.

It will be understood that one of skill in the art will readily recognize minor changes and modifications that may be made in the disclosed invention. The incorporation of minor changes and modifications should not remove the invention from the scope and spirit of the claims set forth below.

We claim:

1. A high density memory module comprising:
   an electronic circuit substrate comprising a plurality of circuit paths and electrical contact points for contact with electronic memory chips;
   a plurality of electronic memory chips, each said chip having a plurality of faces and having a plurality of electrical contact points disposed on one face of said faces and adjacent one edge of said one face of each said chip;

an electrical power distribution means for distributing electrical power to said electronic memory chips, said power distribution means comprising a pair of capacitive plates spaced from each other and conductive paths connected to said electrical contact points on said substrate and contacting one of said plates;

a plurality of heat spreading means, with said memory chips thermally, conductively joined thereto, for spreading heat from said memory chips and for conducting said heat away from said memory chips;

a chip holding means for holding said chips and said heat spreading means in predefined positions relative to said contact points on said substrate, and said contact points of said memory chips in contact with said contact points on said substrate.

2. The memory module of claim 1 further comprising:
a plurality of heat sink disposed overlying said plurality of heat spreading means and being in compressive, thermal contact with said plurality of heat spreading means,
whereby said heat sink conducts heat away from said plurality of heat spreading means and dissipates said heat and forces said contact points on said memory chips into electrical contact with said contact points on said substrate.

3. The memory module of claim 2 further comprising a clamping means or forcing said heat sink against said plurality of heat spreading means and forcibly engaging said contact points on said memory chips with said contact points on said substrate.

4. The memory module of claim 3 wherein said clamping means comprises screw threaded members extending through said heat sink.

5. The memory module of claim 1 comprising electrical contacts disposed on said substrate for contact with electrical contacts of a circuit board.

6. The memory module of claim 1 wherein said chip holding means comprises a plurality of parallel slots formed in opposing walls of apertures extending through said chip holding means.

7. The memory module of claim 6 wherein said chip holding means further comprises a positioning means for precisely positioning said heat spreading means, said positioning means comprising a plate defining apertures substantially co-extensive with said apertures of said chip holding means, and comprising positioning notches disposed in edges of said plate defining said apertures of said plate, for constraining the position of said heat spreading means and said memory chip to a predefined spatial position relative to said substrate.

8. The memory module of claim 1 wherein said contact points on said memory chip comprise electrically conductive metal balls rigidly attached to said memory chip.

9. The memory module of claim 1 wherein said contact points on said substrate comprise electrically conductive metal balls rigidly attached to said substrate.

10. The memory module of claim 8 wherein said contact points on said substrate comprise dendritic crystals of an electrically conductive metal extending from said contact points on said substrate for engagement with said metal balls.

11. The memory module of claim 9 wherein said contact points on said memory chip comprise dendritic crystals of an electrically conductive metal extending from said memory chip for engagement with said metal balls.

12. The memory module of claim 6 wherein said slots in said chip holding means are disposed to form an angle with said substrate substantially less than 90 degrees, whereby a first face of said memory chip is disposed to intersect with said substrate at said angle.

13. The memory module of claim 7 wherein said slots in said chip holding means are oriented to form an angle with said substrate substantially less than 90 degrees, whereby a said one of said faces of said memory chip is disposed to intersect with said substrate at said angle.

14. The memory module of claim 12 wherein said contact points of said memory chip and said contact points of said substrate are bridged and contacted by an electrically conductive metal to establish electrical continuity between said bridged contact points.

15. The memory module of claim 13 wherein said contact points of said memory chip and said contact points of said substrate are bridged and contacted by an electrically conductive metal to establish electrical continuity between said bridged contact points.

16. The memory module of claim 15 further comprising an easily deformable, heat conductive material disposed between said plurality of heat spreading means and said heat sink.

17. The memory module of claim 16 wherein said deformable conductive material comprises a foil of indium disposed between said plurality of heat spreading means and said heat sink, thereby assuring an efficient heat conduction path from said plurality of heat spreading means to said heat sink.

18. The memory module of claim 15 wherein at least one of said contact points on said memory chip and at least one of said contact points on said substrate are bridged by a solder joint.

19. A module comprising:
a plurality of memory chips:
a heat spreader of a thermally conductive solid attached to and supporting each of said memory chips;
a memory chip holding frame;
each of said heat spreaders inserted into and supported by said frame;
a heat sink disposed in thermal conductive contact with at least a portion of each of said heat spreaders; and
means for clamping said chips, heat spreaders, frame and heat sink into an assembly.

20. A memory assembly comprising:
a printed circuit board comprising a plurality of sets of electrical contacts and at least one said module of claim 19 disposed over and in contact with at least one of said sets of electrical contacts.

* * * * *